(12) United States Patent
Iwasaki et al.

(10) Patent No.: US 8,026,609 B2
(45) Date of Patent: Sep. 27, 2011

(54) SEMICONDUCTOR DEVICE AND METHOD FOR PRODUCING THE SAME

(75) Inventors: Tomio Iwasaki, Tsukuba (JP); Hideo Miura, Koshigaya (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/759,335

(22) Filed: Apr. 13, 2010

(65) Prior Publication Data

US 2010/0193957 A1 Aug. 5, 2010

Related U.S. Application Data

(60) Continuation of application No. 11/834,081, filed on Aug. 6, 2007, now Pat. No. 7,701,062, which is a division of application No. 11/392,540, filed on Mar. 30, 2006, now Pat. No. 7,253,103, which is a continuation of application No. 10/878,018, filed on Jun. 29, 2004, now Pat. No. 7,030,493, which is a continuation of application No. 09/985,904, filed on Nov. 6, 2001, now abandoned, which is a continuation of application No. 09/255,856, filed on Feb. 23, 1999, now Pat. No. 6,989,599.

(30) Foreign Application Priority Data

Feb. 23, 1998 (JP) .................................... 10-039992

(51) Int. Cl.
*H01L 23/52* (2006.01)
*H01L 23/48* (2006.01)
*H01L 29/40* (2006.01)

(52) U.S. Cl. ................. 257/758; 257/E23.162; 257/751; 257/762; 438/118; 438/622

(58) Field of Classification Search ........... 257/E23.161, 257/E21.584, E23.162, 751, 758, 762, 767, 257/769, 768, 750, 774; 438/118, 622, 625, 438/650, 656, 686, 687
See application file for complete search history.

(56) References Cited

U.S. PATENT DOCUMENTS 4,851,895 A 7/1989 Green et al.
(Continued)

FOREIGN PATENT DOCUMENTS

JP 05-315336 11/1993
(Continued)

OTHER PUBLICATIONS

"Diffusion Barrier Between Copper and Silicon", IBM Technical Disclosure Bulletin, vol. 35, No. 1B, pp. 214-215, Jun. 1992.
(Continued)

*Primary Examiner* — Chris Chu
(74) *Attorney, Agent, or Firm* — Antonelli, Terry, Stout & Kraus, LLP.

(57) ABSTRACT

Provided, is a reliable semiconductor device with a layered interconnect structure that may develop no trouble of voids and interconnect breakdowns, in which the layered interconnect structure comprises a conductor film and a neighboring film as so layered on a semiconductor substrate that the neighboring film is contacted with the conductor film. In the device, the materials for the conductor film and the neighboring film are so selected that the difference between the short side, $a_p$, of the rectangular unit cells that constitute the plane with minimum free energy of the conductor film and the short side, $a_n$, of the rectangular unit cells that constitute the plane with minimum free energy of the neighboring film, $\{|a_p-a_n|/a_p\} \times 100 = A$ (%) and the difference between the long side, $b_p$, of the rectangular unit cells that constitute the plane with minimum free energy of the conductor film and the long side, $b_n$, of the rectangular unit cells that constitute the plane with minimum free energy of the neighboring film, $\{|b_p-b_n|/b_p\} \times 100 = B$ (%) satisfy an inequality of $\{A+B \times (a_p/b_p)\} < 13$. In this, the diffusion of the conductor film is retarded.

17 Claims, 5 Drawing Sheets

U.S. PATENT DOCUMENTS

| | | |
|---|---|---|
| 5,510,651 A | 4/1996 | Manier et al. |
| 5,637,533 A | 6/1997 | Choi |
| 5,674,787 A | 10/1997 | Zhao et al. |
| 5,709,958 A | 1/1998 | Toyoda et al. |
| 5,753,934 A * | 5/1998 | Yano et al. ............... 257/30 |
| 5,824,599 A * | 10/1998 | Schacham-Diamand et al. .................... 438/678 |
| 5,952,114 A * | 9/1999 | Gunji et al. ............... 428/674 |
| 5,969,422 A * | 10/1999 | Ting et al. ............... 257/762 |
| 6,011,284 A * | 1/2000 | Katori et al. ............. 257/295 |
| 6,020,266 A | 2/2000 | Hussein et al. |
| 6,054,331 A | 4/2000 | Woo et al. |
| 6,132,892 A | 10/2000 | Yoshikawa et al. |
| 6,181,012 B1 * | 1/2001 | Edelstein et al. .......... 257/762 |
| 6,197,688 B1 * | 3/2001 | Simpson ..................... 438/678 |
| 6,218,302 B1 * | 4/2001 | Braeckelmann et al. ..... 438/687 |
| 6,262,478 B1 * | 7/2001 | Hurwitz et al. ............. 257/700 |
| 6,703,654 B1 | 3/2004 | Horng et al. |
| 6,989,599 B1 | 1/2006 | Iwasaki et al. |
| 7,030,493 B2 | 4/2006 | Iwasaki et al. |
| 7,083,270 B2 | 8/2006 | Torii et al. |
| 7,185,540 B2 | 3/2007 | Torii et al. |
| 7,253,103 B2 | 8/2007 | Iwasaki et al. |
| 2002/0006468 A1 | 1/2002 | Paranjpe et al. |

FOREIGN PATENT DOCUMENTS

| | | |
|---|---|---|
| JP | 6-236878 | 8/1994 |
| JP | 06-291191 | 10/1994 |
| JP | 08-139185 | 5/1996 |
| JP | 09-069522 | 3/1997 |
| JP | 10-022274 | 1/1998 |
| JP | 10-199970 | 7/1998 |
| JP | 10-229084 | 8/1998 |
| JP | 10-256251 | 9/1998 |
| JP | 10-284601 | 10/1998 |

OTHER PUBLICATIONS

JP 2001-505367 (machine translation only).

Japanese Official Action issued Aug. 18, 2009, for Application No. 2003-346478.

Japanese Official Action dated Mar. 8, 2011, for JP Application No. 2003-346478.

* cited by examiner

ATOMIC CONFIGURATION IN RECTANGULAR UNIT CELLS

SEMICONDUCTOR DEVICE AND METHOD FOR PRODUCING THE SAME

This application is a Continuation application of application Ser. No. 11/834,081, filed Aug. 6, 2007 now U.S. Pat. No. 7,701,062, which is a Divisional application of application Ser. No. 11/392,540, filed Mar. 30, 2006 now U.S. Pat. No. 7,253,103, which is a Continuation application of application Ser. No. 10/878,018, filed Jun. 29, 2004, now U.S. Pat. No. 7,030,493, issued Apr. 18, 2006, which is a Continuation application of application Ser. No. 09/985,904, filed Nov. 6, 2001, now abandoned, which is a Continuation application of application Ser. No. 09/255,856, filed Feb. 23, 1999, now U.S. Pat. No. 6,989,599, issued Jan. 24, 2006, the contents of which are incorporated herein by reference in their entirety.

BACKGROUND OF THE INVENTION

The present invention relates to a semiconductor device, in particular, to that with a layered interconnect structure.

In recent large-scale-integration, high-performance semiconductor devices, copper (Cu) interconnects are being employed as having lower electric resistance than conventional aluminum (Al) interconnects. However, diffusion of copper (Cu) atoms into silicon (Si) substrates or insulating films will detract from the characteristics of the devices. To prevent the copper (Cu) diffusion, a diffusion barrier is formed adjacent, to the copper (Cu) film. As the material for the diffusion barrier, high-melting-point metal films of, for example, titanium nitride (TiN), tungsten (W) or tantalum (Ta) have been investigated, as in the *Nikkei Microdevice* (for July 1992, pp. 74-77).

Large-scale-integration semiconductor devices with fine patterns receive high-density current, in which, therefore, atoms are diffused owing to electron streams flowing therein and to heat as generated by the flow to cause voids and interconnect breakdowns. The problem with the devices is so-called electromigration. As compared with aluminum (Al) films, copper (Cu) films, as having a higher melting point, are difficult to diffuse, and are therefore expected to have good electromigration resistance. However, layered interconnect structures in which a diffusion barrier of, for example, a titanium nitride (TiN) film, a tungsten (W) film or a tantalum (Ta) film is kept in contact with a copper (Cu) film could not have satisfactory electromigration resistance, and therefore often pose the problem of voids and interconnect breakdowns.

SUMMARY OF THE INVENTION

Given that situation, the object of the invention is to provide a reliable semiconductor device with a layered interconnect structure that may develop no trouble of voids and interconnect breakdowns We, the present inventors have clarified that, in a layered interconnect structure where a diffusion barrier of, for example, a titanium nitride (TiN) film, a tungsten (W) film or a tantalum (Ta) film is kept in contact with a copper (Cu) film, the significant difference between the material of the diffusion barrier material and copper (Cu) in the length of the sides of the unit cell brings about disordered atomic configuration in the interface therebetween thereby promoting copper diffusion that results in the trouble of voids and interconnect breakdowns. Therefore, in order to prevent the voids and breakdowns in copper (Cu) interconnects, a material that differs little from copper (Cu) in the length of the sides of the unit cell shall be used for the film to be disposed adjacent to the copper (Cu) film thereby inhibiting the copper diffusion. We have further clarified that, in a layered interconnect structure comprising a conductor film and a neighboring film as layered adjacent to the conductor film, when the difference between the short side, $a_p$, of the rectangular unit cells that constitute the plane with minimum free energy of the conductor film and the short side, $a_n$, of the rectangular unit cells that constitute the plane with minimum free energy of the neighboring film, $\{|a_p-a_n|/a_p\} \times 100 = A$ (%), is smaller than 13% and when the difference between the long side, $b_p$, of the rectangular unit cells that constitute the plane with minimum free energy of the conductor film and the long side, $b_n$, of the rectangular unit cells that constitute the plane with minimum free energy of the neighboring film, $\{|b_p-b_n|/b_p\} \times 100 = B$ (%), as multiplied by $(a_p/b_p)$, is smaller than 13, then the diffusion of the conductor film is retarded to prevent voids and interconnect breakdowns. In addition, we have still further clarified that, especially when A and B satisfy an inequality of $\{A+B\times(a_p/b_p)\}<13$, preferred results are obtained. The definitions of the short side, a, and the long side, b, in rectangular unit cells as referred to herein are illustrated in FIG. 6.

Therefore, the object of the invention noted above is attained by a semiconductor device with a layered interconnect structure comprising a conductor film and a neighboring film as so layered on a semiconductor substrate that the neighboring film is contacted with the conductor film, wherein the materials for the conductor film and the neighboring film are so selected that the difference between the short side, $a_p$, of the rectangular unit cells that constitute the plane with minimum free energy of the conductor film and the short side, $a_n$, of the rectangular unit cells that constitute the plane with minimum free energy of the neighboring film, $\{|a_p-a_n|/a_p\}100=A$ (%) and the difference between the long side, $b_p$, of the rectangular unit cells that constitute the plane with minimum free energy of the conductor film and the long side, $b_n$, of the rectangular unit cells that constitute the plane with minimum free energy of the neighboring film, $\{|b_p-b_n|/b_p\} \times 100=B$ (%) satisfy an inequality of $\{A+B\times(a_p/b_p)\}<13$.

The object is also attained by a semiconductor device with a layered interconnect structure comprising a copper (Cu) film and a neighboring film as so layered on a semiconductor substrate that the neighboring film is contacted with the copper (Cu) film, wherein the neighboring film is any of a rhodium (Rh) film, a ruthenium (Ru) film, an iridium (Ir) film, an osmium (Os) film or a platinum (Pt) film.

The object is also attained by a semiconductor device with a layered interconnect structure comprising a platinum (Pt) film and a neighboring film as so layered on a semiconductor substrate that the neighboring film is contacted with the platinum (Pt) film, wherein the neighboring film is any of a rhodium (Rh) film, a ruthenium (Ru) film, an iridium (Ir) film or an osmium (Os) film.

Concretely, preferred embodiments of the invention are as follows:

A semiconductor device with a layered structure comprising a copper (Cu) film interconnect formed on one primary surface of a semiconductor substrate, and a diffusion barrier formed in contact with the copper (Cu) film interconnect, wherein the diffusion barrier is of a ruthenium (Ru) film, and the copper (Cu) film interconnect has a layered structure comprising a copper (Cu) film as formed through sputtering and a copper (Cu) film as formed through plating.

A semiconductor device with a layered structure comprising a copper (Cu) film interconnect formed on one primary surface of a semiconductor substrate, and a diffusion barrier formed in contact with the copper (Cu) film interconnect, wherein the diffusion barrier is of a ruthenium (Ru) film, and the copper (Cu) film interconnect has a layered structure comprising a copper (Cu) film as formed through physical vapor deposition (PVD) and a copper (Cu) film as formed through chemical vapor deposition (CVD).

A semiconductor device with a layered structure comprising a copper (Cu) film interconnect formed on one primary surface of a semiconductor substrate, and a diffusion barrier formed in contact with the copper (Cu) film interconnect, wherein the diffusion barrier is of a sputter-deposited ruthenium (Ru) film, and the copper (Cu) film interconnect has a layered structure comprising a copper (Cu) film as formed through sputtering and a copper (Cu) film as formed through plating or chemical vapor deposition (CVD).

A semiconductor device with a structure comprising a copper (Cu) film interconnect formed on one primary surface of a semiconductor substrate, and a plug formed in contact with the copper (Cu) film interconnect, wherein the plug is of at least one film selected from the group consisting of a rhodium (Rh) film, a ruthenium (Ru) film, an iridium (Ir) film, an osmium (Os) film and a platinum (Pt) film, and at least one of the copper (Cu) film interconnect and the plug contains a layer as formed through physical vapor deposition (PVD).

A semiconductor device with a structure comprising a copper (Cu) film interconnect formed on one primary surface of a semiconductor substrate, a diffusion barrier formed in contact with the copper (Cu) film interconnect, and a plug formed in contact with the diffusion barrier, wherein the diffusion barrier is of a ruthenium (Ru) film, the plug is of a ruthenium (Ru) film, and at least one of the copper (Cu) film interconnect and the plug contains a layer as formed through physical vapor deposition (PVD).

A semiconductor device with a structure comprising a copper (Cu) film interconnect formed on one primary surface of a semiconductor substrate, a first diffusion barrier formed in contact with the copper (Cu) film interconnect, a plug formed in contact with the first diffusion barrier, and a second diffusion barrier formed in contact with the plug and the first diffusion barrier, wherein the first diffusion barrier is of a ruthenium (Ru) film, the plug is of a ruthenium (Ru) film, the second diffusion barrier is of a titanium nitride (TiN) film, and at least one of the copper (Cu) film interconnect and the first diffusion barrier is of a film as formed through sputtering.

A semiconductor device with a structure comprising a platinum (Pt) electrode film formed on one primary surface of a semiconductor substrate, and a neighboring film formed in contact with the platinum (Pt) electrode film, wherein the neighboring film is at least one film selected from the group consisting of a rhodium (Rh) film, a ruthenium (Ru) film, an iridium (Ir) film and an osmium (Os) film, and at least one of the platinum (Pt) electrode film and the neighboring film is of a film as formed through sputtering.

A method for producing semiconductor devices, which comprises the following steps:

a step of forming a ruthenium (Ru) film on one primary surface of a semiconductor substrate through sputtering;

a step of forming a first copper (Cu) film to be in contact with the ruthenium (Ru) film, through sputtering; and a step of forming a second copper (Cu) film to be in contact with the first copper (Cu) film, through plating or chemical vapor deposition (CVD).

DESCRIPTION OF PREFERRED
EMBODIMENTS OF THE INVENTION

Embodiments of the invention are described hereinunder with reference to the drawings.

Figure 1:
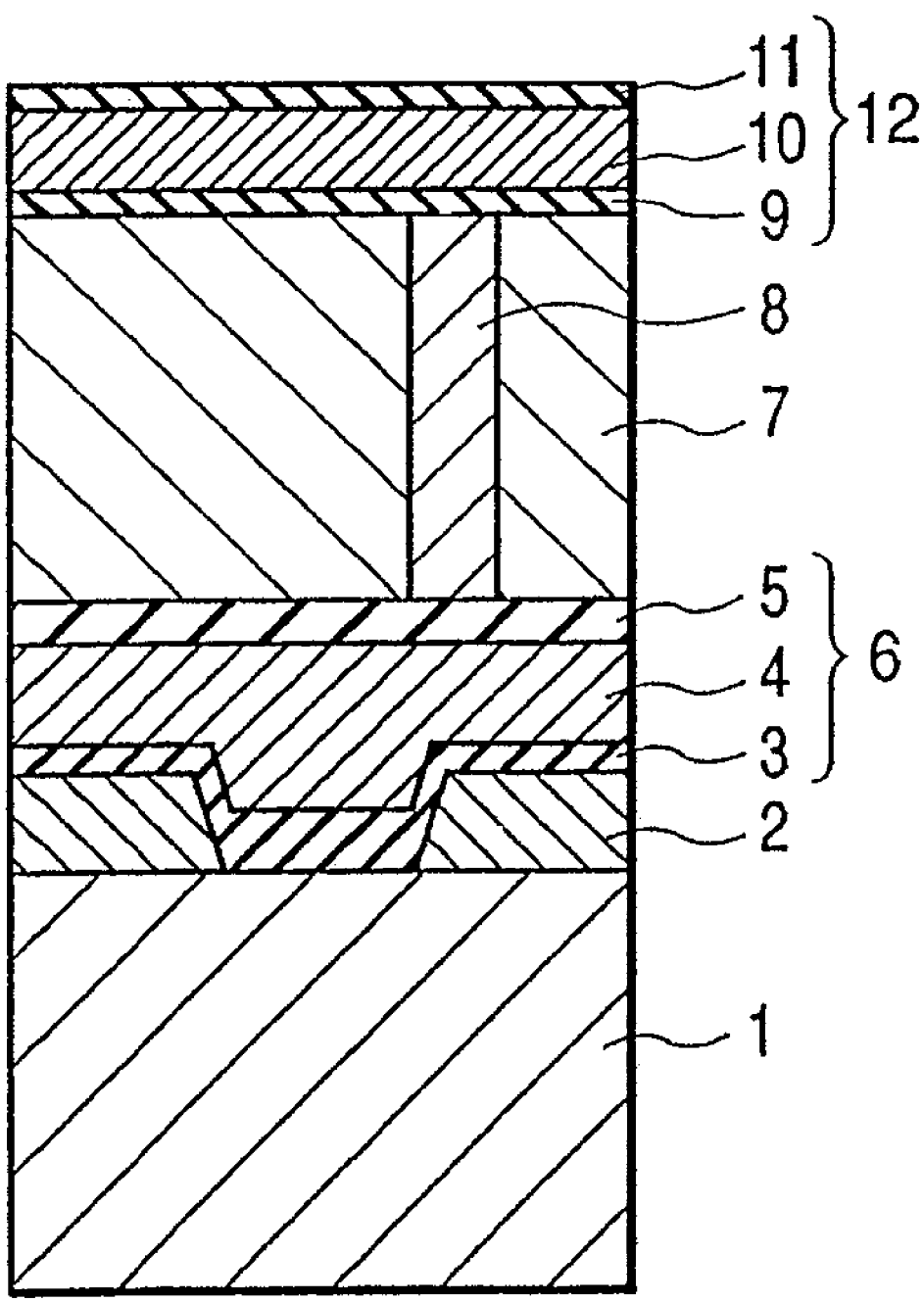
FIG. 1 is a cross-sectional view showing a layered interconnect structure of a semiconductor device of the first embodiment of the invention.

First referred to is FIG. 1, which shows a cross-sectional structure of the layered interconnect structure part of a semiconductor device of the first embodiment of the invention.

As in FIG. 1, the layered interconnect structure in the semiconductor device of this embodiment comprises an insulating film 2 of, for example, silicon oxide as formed on a silicon substrate 1, in which a first layered interconnect structure 6 composed of a neighboring film 3, a conductor film 4 and a neighboring film 5 is connected with the substrate 1 via a contact hole as formed through the insulating film 2. In this, an insulating film 7 of, for example, silicon oxide is formed on the first layered interconnect structure 6, and a via 8 of, for example, tungsten (W) is filled in the via hole as formed through the insulating film 7. Through this via 8, a second layered interconnect structure 12 composed of a neighboring film 9, a conductor film 10 and a neighboring film 11 is connected with the first layered interconnect structure 6. The first layered interconnect structure 6 is characterized in that the neighboring film 3, the conductor film 4 and the neighboring film 5 are formed of a combination of materials satisfying an inequality of $\{(A+B\times(a_p/b_p)\}<13$, where A indicates the difference between the short side, $a_p$, of the rectangular unit cells that constitute the plane with minimum free energy of the conductor film 4 and the short side, $a_n$, of the rectangular unit cells that constitute the plane with minimum free energy of the neighboring films 3, 5, and is represented as $\{|a_p-a_n|/a_p\}\times100=A$ (%), and B indicates the difference between the long side, $b_p$, of the rectangular unit cells that constitute the plane with minimum free energy of the conductor film 4 and the long side, $b_n$, of the rectangular unit cells that constitute the plane with minimum free energy of the neighboring films 3, 5, and is represented as $\{|b_p-b_n|/b_p\}\times100=B$ (%). Concretely, where the conductor film 4 is a copper (Cu) film, the neighboring films 3, 5 could be any of a rhodium (Rh) film, a ruthenium (Ru) film, an iridium (Ir) film, an osmium (Os) film and a platinum (Pt) film. Where the conductor film 4 is a platinum (Pt) film, the neighboring films 3, 5 could be any of a rhodium (Rh) film, a ruthenium (Ru) film, an iridium (Ir) film and an osmium (Os) film.

Like this, the second layered interconnect structure 12 is characterized in that the neighboring film 9, the conductor film 10 and the neighboring film 11 are formed of a combination of materials satisfying an inequality of $\{A+B \times (a_p/b_p)\}<13$, where A indicates the difference between the short side, $a_p$, of the rectangular unit cells that constitute the plane with minimum free energy of the conductor film 10 and the short side, $a_n$, of the rectangular unit cells that constitute the plane with minimum free energy of the neighboring films 9, 11, and is represented as $\{|a_p-a_n|/a_p\} \times 100=A$ (%), and B indicates the difference between the long side, $b_p$, of the rectangular unit cells that constitute the plane with minimum free energy of the conductor film 10 and the long side, $b_n$, of the rectangular unit cells that constitute the plane with minimum free energy of the neighboring films 9, 11, and is represented as $\{|b_p-b_n|/b_p\} \times 100=B$ (%). Concretely, where the conductor film 10 is a copper (Cu) film, the neighboring films 9, 11 could be any of a rhodium (Rh) film, a ruthenium (Ru) film, an iridium (Ir) film, an osmium (Os) film and a platinum (Pt) film. Where the conductor film 10 is a platinum (Pt) film, the neighboring films 9, 11 could be any of a rhodium (Rh) film, a ruthenium (Ru) film, an iridium (Ir) film and an osmium (Os) film.

The effect of the semiconductor device of this embodiment is described below.

We, the inventors have specifically noticed the difference between the conductor film and the neighboring film in the short side, a, and the long side, b, of the rectangular unit cells that constitute the plane with minimum free energy of those films, and investigated the influence of this difference on the diffusion coefficient of the conductor film through computer simulation. Concretely, for the layered interconnect structure comprising a conductor film and a neighboring film as so layered that the two are in contact with each other, prepared was a map where the abscissa indicates the difference between the short side, $a_p$, of the rectangular unit cells that constitute the plane with minimum free energy of the conductor film and the short side, $a_n$, of the rectangular unit cells that constitute the plane with minimum free energy of the neighboring film, $\{|a_p-a_n|/a_p\} \times 100=A$ (%), and the ordinate indicates the difference between the long side, $b_p$, of the rectangular unit cells that constitute the plane with minimum free energy of the conductor film and the long side, $b_n$, of the rectangular unit cells that constitute the plane with minimum free energy of the neighboring film, $\{|b_p-b_n|/b_p\} \times 100=B$ (%), as multiplied by $(a_p/b_p)$. Based on the data of A and B as defined to cover the map, the value of the diffusion coefficient of the conductor film was calculated through computer simulation.

Figure 2:
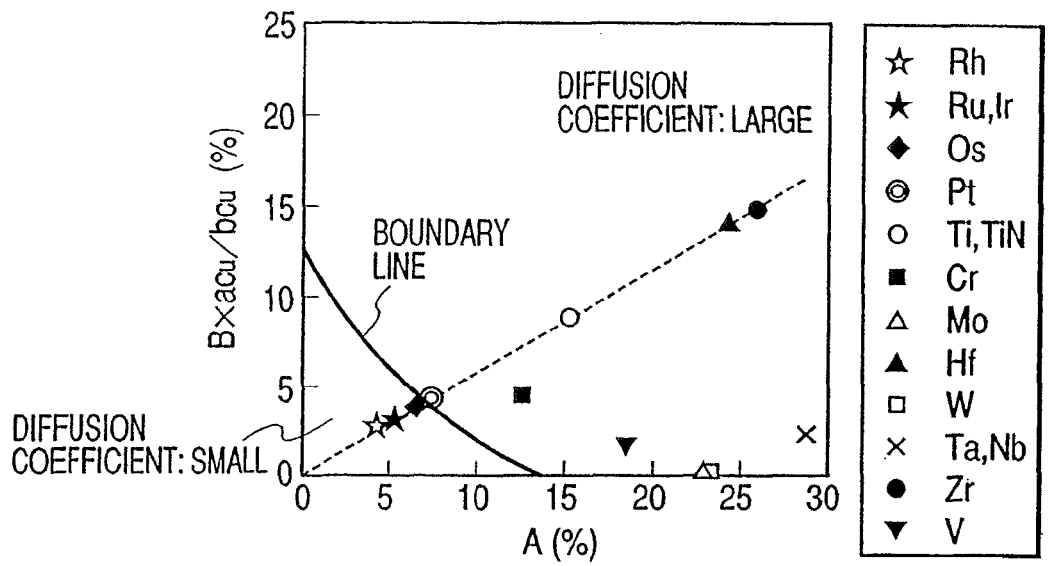
FIG. 2 is a graph indicating the effect of neighboring film materials on a conductor film of copper (Cu), relative to the diffusion coefficient of the copper (Cu) film.
Figure 3:
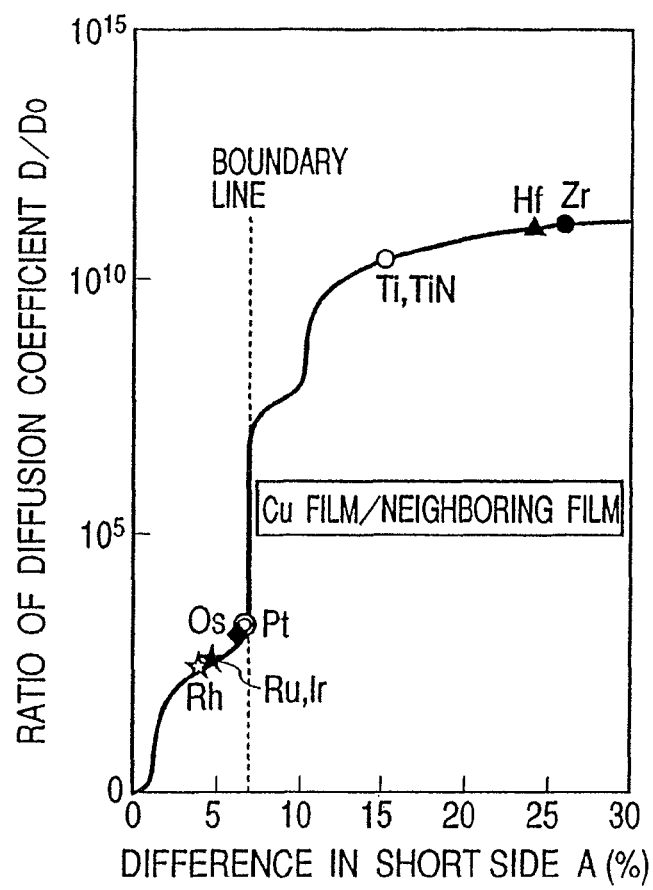
FIG. 3 is a characteristic curve indicating the effect of neighboring film materials on a conductor film of copper (Cu), relative to the diffusion coefficient of the copper (Cu) film along the dotted line in FIG. 2.

First conducted was the simulation for a conductor film of copper (Cu) at a temperature of 700 K. Copper (Cu) has the face-centered cubic (fcc) structure, and the plane with minimum free energy of copper (Cu) is the (111) plane. The simulation data of this case are shown in FIG. 2, in which the diffusion coefficient of the copper (Cu) film greatly increases in the upper region as separated by the boundary line. In the lower region as separated by the boundary line, which is near to the origin of the coordinate axes, the diffusion coefficient is small and voids are hardly formed, while in the upper region as separated by it, the diffusion coefficient is large and voids are easily formed. To check this aspect in detail, the diffusion coefficient of the copper (Cu) film was investigated along the dotted line in FIG. 2, and the data are shown in FIG. 3. In FIG. 3, D indicates the diffusion coefficient or the copper (Cu) film, and $D_0$ indicates the diffusion coefficient of copper (Cu) in bulk. In this, it is known that the diffusion coefficient greatly increases in the right-hand region as separated by the boundary line, in which titanium nitride (TiN) and others used in conventional neighboring films are positioned. Referring back to FIG. 2, it is known that the tungsten (W) film and the tantalum (Ta) film are also in the upper region above the boundary line. On the other hand, in FIG. 2, the rhodium (Rh) film, the ruthenium (Ru) film, the iridium (Ir) film, the osmium (Os) film and the platinum (Pt) film are all positioned in the lower region below the boundary line, or that is, in the region near to the origin of the coordinate axes, and it is known that these films are effective for preventing the copper (Cu) film from diffusion. The materials of those films are all within the region in which both A and $B \times (a_p/b_p)$ are smaller than 13%. Linear approximation to the boundary line in FIG. 2 gives $\{A+B \times (a_p/b_p)\}=13$. Therefore, in the structure composed of a conductor film and a neighboring film as formed of a combination of materials that satisfies the inequality of $\{A+B \times (a_p/b_p)\}<13$, copper diffusion is retarded and voids and interconnect breakdowns are thereby prevented. In this, the diffusion coefficient of the copper (Cu) film is specifically noticed and it is judged that voids are hardly formed in the copper (Cu) film with a smaller diffusion coefficient. Also in neighboring films, it is desired that the voids are hardly formed. For this, it is more desirable that the neighboring films are made of a material having a high melting point. For example, more preferred for the neighboring films are rhodium (having a melting point of 1,960° C.), ruthenium (having a melting point of 2,310° C.), iridium (having a melting point of 2,443° C.) and osmium (having a melting point of 3,045° C.) to platinum (having a melting point of 1,769° C.), since the melting point of the former is all higher than that of platinum.

Figure 4:
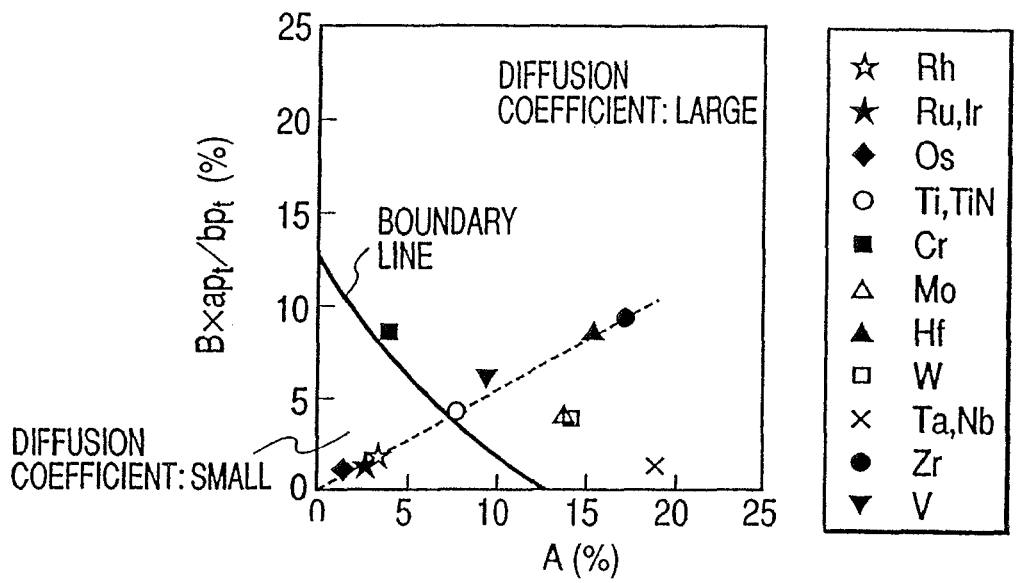
FIG. 4 is a characteristic graph indicating the effect of neighboring film materials on a conductor film of platinum (Pt), relative to the diffusion coefficient of the platinum (Pt) film.
Figure 5:
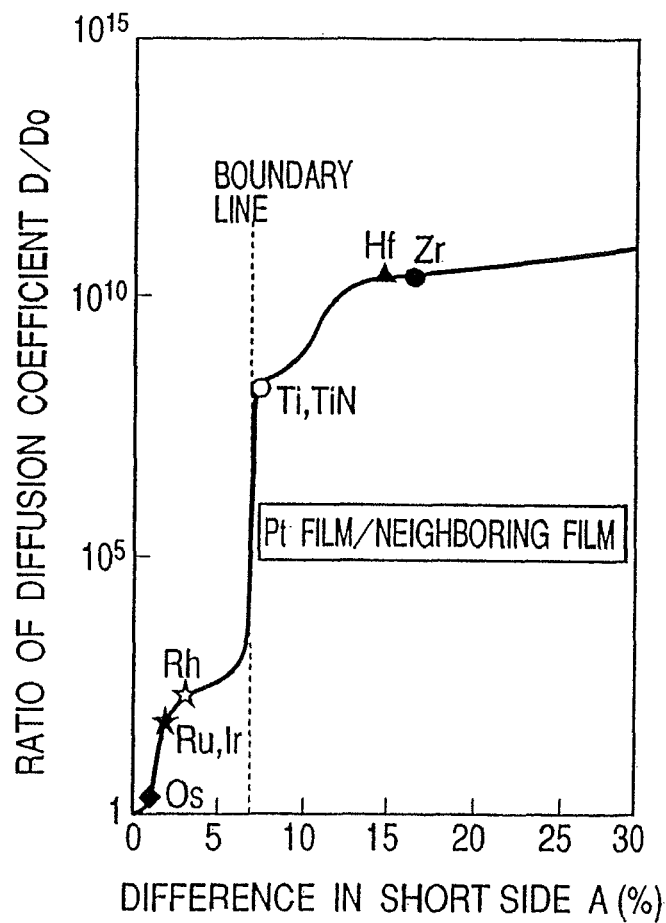
FIG. 5 is a characteristic curve indicating the effect of neighboring film materials on a conductor film of platinum (Pt), relative to the diffusion coefficient of the platinum (Pt) film along the dotted line in FIG. 4.

Next conducted was the simulation for a conductor film of platinum (Pt). Like copper (Cu), platinum (Pt) has the face-centered cubic (fcc) structure, and the plane with minimum free energy of platinum (Pt) is the (111) plane. The simulation data of this case are shown in FIGS. 4 and 5. The same as in FIG. 2 shall apply to the data in FIG. 4. Also in FIG. 4, in the lower region as separated by the boundary line, which is near to the origin of the coordinates axes, the diffusion coefficient is small and voids are hardly formed, while in the upper region as separated by it, the diffusion coefficient is large and voids are easily formed. To check this aspect in detail, the diffusion coefficient of the platinum (Pt) film was investigated along the dotted line in FIG. 4, and the data are shown in FIG. 5. In FIG. 5, D indicates the diffusion coefficient of the platinum (Pt) film, and $D_0$ indicates the diffusion coefficient of platinum (Pt) in bulk. In this, it is known that the diffusion coefficient greatly increases in the right-hand region as separated by the boundary line. Referring back to FIG. 4, it is known that the rhodium (Rh) film, the ruthenium (Ru) film, the iridium (Ir) film and the osmium (Os) film are all positioned in the lower region below the boundary line. This means that the materials for these films are effective for preventing the platinum (Pt) film from diffusion. Those materials are all within the region in which both A and $B \times (a_p/b_p)$ are smaller than 13%. It is understood that the position of the boundary line in FIG. 4 well corresponds to that of the boundary line for the copper (Cu) film noted above. Linear approximation to those boundary lines gives $\{A+B \times (a_p/b_p)\}=13$. Therefore, in the structure composed of a conductor film and a neighboring film as formed of a combination of materials that satisfies the inequality of $\{A+B\times(a_p/b_p)\}<13$, conductor film diffusion is retarded and voids and interconnect breakdowns are thereby prevented.

Figure 7:
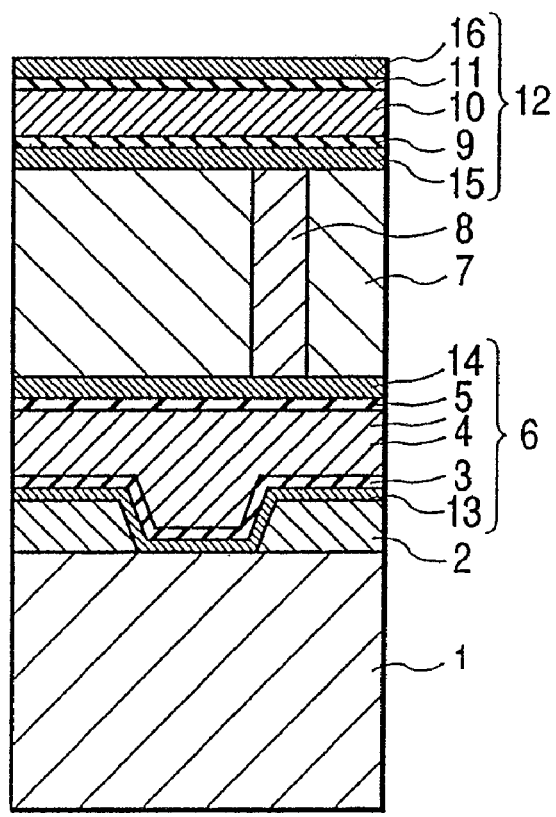
FIG. 7 is a cross-sectional view showing a layered interconnect structure of a semiconductor device of the second embodiment of the invention.

Next referred to is FIG. 7 which shows a cross-sectional structure of a layered interconnect structure part of a semiconductor device of the second embodiment of the invention.

As in FIG. 7, the layered interconnect structure in the semiconductor device of this embodiment comprises an insulating film 2 of, for example, silicon oxide as formed on a silicon substrate 1, in which a first layered interconnect structure 6 composed of a diffusion barrier 13, a neighboring film 3, a conductor film 4, a neighboring film 5 and a diffusion barrier 14 is connected with the substrate 1 via a contact hole as formed through the insulating film 2. In this, an insulating film 7 of, for example, silicon oxide is formed on the first layered interconnect structure 6, and a via 8 of, for example, tungsten (W) is filled in the via hole as formed through the insulating film 7. Through this via 8, a second layered interconnect structure 12 composed of a diffusion barrier 15, a neighboring film 9, a conductor film 10, a neighboring film 11 and a diffusion barrier 16 is connected with the first layered interconnect structure 6. The diffusion barriers 13, 14, 15, 16 comprise, for example, titanium nitride (TiN), tungsten (W), tantalum (Ta) or the like. The first layered interconnect structure 6 is characterized in that the neighboring film 3, the conductor film 4 and the neighboring film 5 are formed of a combination of materials satisfying an inequality of $\{A+B\times(a_p/b_p)\}<13$, where A indicates the difference between the short side, $a_p$, of the rectangular unit cells that constitute the plane with minimum free energy of the conductor film 4 and the short side, $a_n$, of the rectangular unit cells that constitute the plane with minimum free energy of the neighboring films 3, 5, and is represented as $\{|a_p-a_n|/a_p\}\times 100 = A$ (%), and B indicates the difference between the long side, $b_p$, of the rectangular unit cells that constitute the plane with minimum free energy of the conductor film 4 and the long side, $b_a$, of the rectangular unit cells that constitute the plane with minimum free energy of the neighboring films 3, 5, and is represented as $\{|b_p-b_n|/b_p\}\times 100 = B$ (%). Concretely, where the conductor film 4 is a copper (Cu) film, the neighboring films 3, 5 could be any of a rhodium (Rh) film, a ruthenium (Ru) film, an iridium (Ir) film, an osmium (Os) film and a platinum (Pt) film. Where the conductor film 4 is a platinum (Pt) film, the neighboring films 3, 5 could be any of a rhodium (Rh) film, a ruthenium (Ru) film, an iridium (Ir) film and an osmium (Os) film.

Like this, the second layered interconnect structure 12 is characterized in that the neighboring film 9, the conductor film 10 and the neighboring film 11 are formed of a combination of materials satisfying an inequality of $\{A+B\times(a_p/b_p)\}<13$, where A indicates the difference between the short side, $a_p$, of the rectangular unit cells that constitute the plane with minimum free energy of the conductor film 10 and the short side, $a_n$, of the rectangular unit cells that constitute the plane with minimum free energy of the neighboring films 9, 11, and is represented as $\{|a_p-a_n|/a_p\}\times 100 = A$ (%), and B indicates the difference between the long side, $b_p$, of the rectangular unit cells that constitute the plane with minimum free energy of the conductor film 10 and the long side, $b_n$, of the rectangular unit cells that constitute the plane with minimum free energy of the neighboring films 9, 11, and is represented as $\{|b_p-b_n|/b_p\}\times 100 = B$ (%). Concretely, where the conductor film 10 is a copper (Cu) film, the neighboring films 9, 11 could be any of a rhodium (Rh) film, a ruthenium (Ru) film, an iridium (Ir) film, an osmium (Os) film and a platinum (Pt) film. Where the conductor film 10 is a platinum (Pt) film, the neighboring films 9, 11 could be any of a rhodium (Rh) film, a ruthenium (Ru) film, an iridium (Ir) film and an osmium (Os) film.

Figure 8:
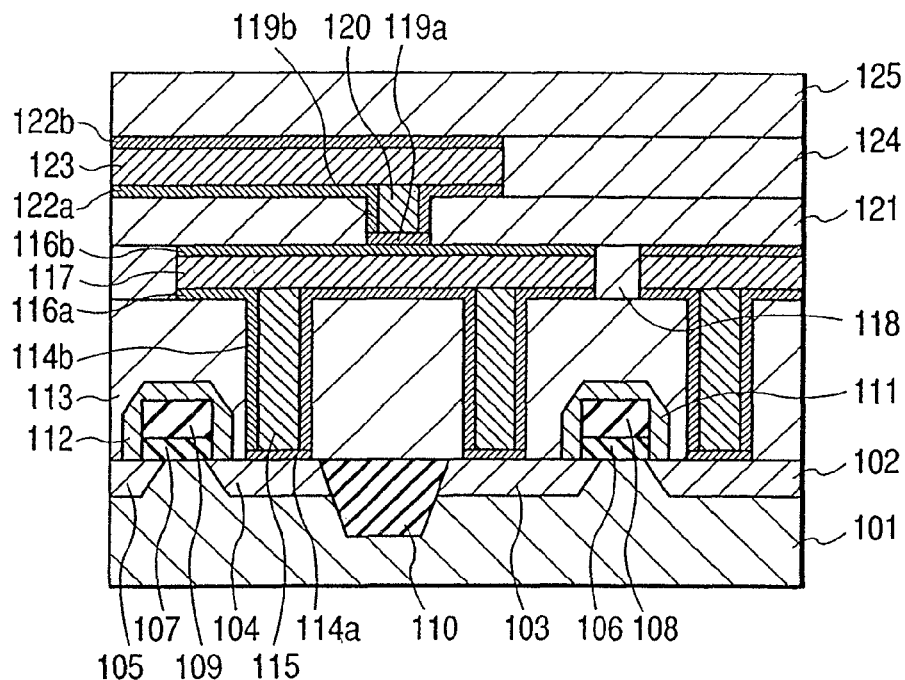
FIG. 8 is a cross-sectional view showing the principal part of a semiconductor device of the third embodiment of the invention.

Next referred to is FIG. 8 which shows a cross-sectional structure of a principal part of a semiconductor device of the third embodiment of the invention. As in FIG. 8, the semiconductor device of this embodiment comprises diffusion layers 102, 103, 104, 105 all formed on a silicon substrate 101, on which are formed gate-insulating films 106, 107 and gate electrodes 108, 109 to construct MOS transistors. The gate-insulating films 106, 107 are, for example, silicon oxide films or silicon nitride films; and the gate electrodes 108, 109 are, for example, polycrystalline silicon films, thin metal films or metal silicide films, or are of a layered structure comprising any of them. The MOS transistors are separated from each other by an isolation film 110 of, for example, a silicon oxide film. The gate electrodes 108, 109 are covered with insulating films 111, 112, respectively, or, for example, silicon oxide films, entirely on their top and side surfaces. The MOS transistors are entirely covered with an insulating film 113, which may be, for example, a BPSG (boron-doped phosphosilicate glass) or SOG (spin on glass) film or with a silicon oxide or nitride film as formed through chemical vapor deposition (CVD) or physical vapor deposition (PVD). In each contact hole as formed through the insulating film 113, formed is a plug of a conductor film 115 which is in contact with neighboring films 114a, 114b of diffusion barriers. The plugs are connected with the diffusion layers 102, 103, 104, 105. Via the plugs, the diffusion layers are connected with a layered interconnect that comprises a conductor film 117 as coated with neighboring films 116a, 116b of diffusion barriers. The layered interconnect is formed, for example, by forming trenches for interconnection in an insulating film 118, then forming a neighboring film 116a at the bottom of each trench, forming a conductor film 117 on the film 116a, and further forming a neighboring film 116b on the film 117. When the neighboring films 116a, 116b of diffusion barriers and the conductor film 117 are formed, at least one of those films 116a, 116b and 117 is formed at least through physical vapor deposition (PVD) as in the ordinary manner. Where the conductor film 117 is formed through physical vapor deposition, it may be formed first through physical vapor deposition such as sputtering or the like in some degree, and thereafter according to different film-forming method (of, for example, plating or chemical vapor deposition that is favorable to film formation in narrow trenches) as in the ordinary manner. Electromigration resistance is especially important for the case of switching film-forming methods. Without switching to such a different film-forming method, the physical vapor deposition may be continued to finish the film 117. On the film 117, formed is a plug of a conductor film 120. For this, a via hole is formed through an insulating film 121 having been formed on the film 118, and the conductor film 120 coated with neighboring films 119a, 119b of diffusion barriers is formed in the via hole. The plug is thus connected with the layered interconnect formed previously. Via the plug, a second layered interconnect that comprises a conductor film 123 as coated with neighboring films 122a, 122b of diffusion barriers is connected with the conductor film 117. The second layered interconnect is formed, for example, by forming trenches for interconnection in an insulating film 124, then forming the neighboring film 122a at the bottom of each trench, for example through chemical vapor deposition, forming the conductor film 123 on the film 122a, and further forming the neighboring film 122b on the film 123, for example, through chemical vapor deposition. The second layered interconnect may be formed before the insulating film 124 is formed. The conductor film 123 may be formed first through physical vapor deposition in some degree, and thereafter according to a different film-forming method (of, for example, plating or chemical vapor deposition). For forming the plug of the conductor film 120 as coated with the neighboring films 119a, 119b, and the second layered interconnect, another process may be employed which comprises forming trenches in the insulating films 121, 124, then forming the neighboring films 119a, 119b and the neighboring film 122a all at a time, and thereafter forming the conductor film 120 and the conductor film 123. An insulating film 125 is, for example, a silicon oxide film.

In the third embodiment, at least one of the conductor film 117 as coated with the neighboring films 116a, 116b, and the conductor film 123 as coated with the neighboring films 122a, 122b shall be formed of a combination of materials that satisfies an inequality of $\{A+B\times(a_p/b_p)\}<13$, where A indicates the difference between the short side, $a_n$, of the rectangular unit cells that constitute the plane with minimum free energy of the neighboring films and the short side, $a_p$, of the rectangular unit cells that constitute the plane with minimum free energy of the conductor film, and is represented as $\{|a_p-a_n|/a_p\}\times100=A$ (%), and B indicates the difference between the long side, $b_n$, of the rectangular unit cells that constitute the plane with minimum free energy of the neighboring films and the long side, $b_p$, of the rectangular unit cells that constitute the plane with minimum free energy of the conductor film, and is represented as $\{|b_p-b_n|/b_p\}\times100=B$ (%). This is for the purpose of retarding the diffusion of the conductor film so as to prevent voids that may be caused by so-called electromigration. Concretely, for example, where the conductor film 117 is a copper (Cu) film, the neighboring films 116a, 116b could be any one selected from the group consisting of a rhodium (Rh) film, a ruthenium (Ru) film, an iridium (Ir) film, an osmium (Os) film and a platinum (Pt) film. Since the conductor films 115, 120 for the plugs are adjacent to the conductor film 117, they could be considered as the neighboring films to the conductor film 117. Therefore, where the conductor film 117 is a copper (Cu) film, the plugs 115, 120 could be any one selected from the group consisting of a rhodium (Rh) film, a ruthenium (Ru) film, an iridium (Ir) film, an osmium (Os) film and a platinum (Pt) film, by which the diffusion of the conductor film 117 is retarded to prevent voids that may be caused by so-called electromigration. In that constitution, since the rhodium (Rh) film, the ruthenium (Ru) film, the iridium (Ir) film, the osmium (Os) film and the platinum (Pt) film for the plug all have a higher melting point than a copper (Cu) film, the plug could exhibit an additional effect of such that its resistance against heat is higher than that of plugs of conductor films 115, 120 of being copper (Cu) films. In this case, it is desirable that the neighboring films 114a, 114b, 119a, 119b to be adjacent to the conductor films 115, 120 are titanium nitride (TiN) films, as exhibiting good adhesiveness to the insulating films 113, 121. It the adhesiveness between them could be neglected, the neighboring films 114a, 114b, 119a, 119b may be omitted. Where the low level of electric resistance of the plug is regarded as more important than the resistance thereof against heat, a copper (Cu) film is used for the conductor films 115, 120 for the plug, and any one selected from the group consisting of a rhodium (Rd) film, a ruthenium (Ru) film, an iridium (Ir) film, an osmium (Os) film and a platinum (Pt) film is used for the neighboring films 114a, 114b, 119a, 119b adjacent to the conductor films 115, 120. Though not shown in FIG. 8, any one or more additional layers may be formed between each of the neighboring films 116a, 116b, 122a, 122b, 114a, 114b, 119a, 119b and the insulating film adjacent thereto, as in FIG. 7.

Though not in FIG. 8, it is desirable to provide a diffusion barrier also on the side walls of the conductor film 117 and the conductor film 123, in order to prevent atoms from diffusing into the insulating films through the side walls of the conductor films 117, 123.

The invention is not limited to only interconnects, diffusion barriers and plugs, but could apply to electrodes.

For example, where the gate electrodes 108, 109 have a layered structure that comprises a conductor film and a neighboring film, they may be formed of a combination of materials that satisfies an inequality of $\{A+B\times(a_p/b_p)\}<13$, in which A indicates the difference between the short side, $a_n$, of the rectangular unit cells that constitute the plane with minimum free energy of the neighboring film and the short side, $a_p$, of the rectangular unit cells that constitute the plane with minimum free energy of the conductor film, and is represented as $\{|a_p-a_n|/a_p\}\times100=A$ (%), and B indicates the difference between the long side, $b_a$, of the rectangular unit cells that constitute the plane with minimum free energy of the neighboring film and the long side, $b_p$, of the rectangular unit cells that constitute the plane with minimum free energy of the conductor film, and is represented as $\{|b_p-b_n|/b_p\}\times100=B$ (%). This is for the purpose of retarding the diffusion of the conductor film so as to prevent voids that may be caused by so-called electromigration. Concretely, for example, where the conductor film is a copper (Cu) film, the neighboring film could be any one selected from the group. consisting of a rhodium (Rh) film, a ruthenium (Ru) film, an iridium (Ir) film, an osmium (Os) film and a platinum (Pt) film. Where the conductor film is a platinum (Pt) film, the neighboring film could be any one selected from the group consisting of a rhodium (Rh) film, a ruthenium (Ru) film, an iridium (Ir) film and an osmium (Os) film. If desired, an additional film of titanium nitride or the like may be provided between the gate electrodes 108, 109 and the gate insulating films 106, 107.

In the embodiments mentioned above, where a copper (Cu) film is used for the, conductor film, any one selection from the group consisting of a rhodium (Rh) film, a ruthenium (Ru) film, an iridium (Ir) film, an osmium (Os) film and a platinum (Pt) film is used for the neighboring film for retarding the copper diffusion. Of those, a ruthenium (RU) film will be the best for the neighboring film, as having a high melting point and being easy to work.

Figure 9:
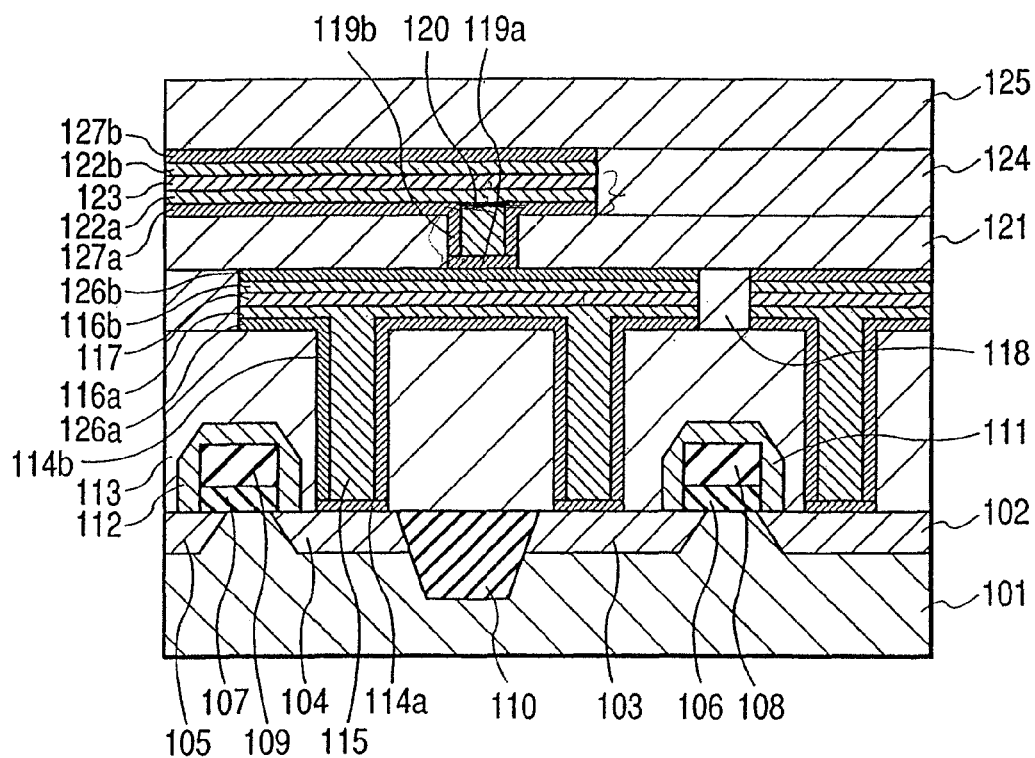
FIG. 9 is a cross-sectional view showing the principal part with a preferred functional structure of a semiconductor device of the third embodiment of the invention.

FIG. 9 is referred to, which shows one preferred functional structure of the semiconductor device of the third embodiment. The structural difference between FIG. 9 and FIG. 8 is that, in FIG. 9, a neighboring film 126a is formed between the neighboring film 116a and the insulating film 113, a neighboring film 126b is formed between the neighboring film 116b and the insulating film 121, a neighboring film 127a is formed between the neighboring film 122a and the insulating film 121, and a neighboring film 127b is formed between the neighboring film 122b and the insulating film 121. The conductor films 117, 123 to be interconnects are copper (Cu) films having a low electric resistance, in order that the device could have good capabilities for rapid operation. In order to make the copper (Cu) film interconnects have good electromigration resistance, the neighboring films 116a, 116b, 122a, 122b of diffusion barriers for the copper (Cu) films 117, 123 are ruthenium (Ru) films. The plugs 115, 120 adjacent to the copper (Cu) films 117, 123 are ruthenium (Ru) films so as to have good electromigration resistance. Electromigration resistance is especially important near plugs, for example, as in "Materials Reliability in Microelectronics", pp. 81-86 in Vol. 428 of *Symposium Proceedings of the Materials Research Society* (MRS). The ruthenium (Ru) plugs have the advantage of good resistance against heat. In that constitution, the plug 115 and the diffusion barrier 116a are both ruthenium (Ru) films, and it is desirable to form these films both at a time as facilitating the film formation. Like those, the plug 120 and the diffusion barrier 127a are also both ruthenium (Ru) films, and it is desirable to form these films both at a time as facilitating the film formation. In order to enhance the adhesiveness between the ruthenium (Ru) films and the insulating films adjacent thereto, the diffusion barriers 126a, 126b, 127a, 127b, 114a, 114b, 119a, 119b all are of a titanium nitride (TiN) film. In that constitution, the diffusion barriers 114a, 114b and the diffusion barrier 126a are all titanium nitride (TiN) films, and it is desirable to form these films all at a time as facilitating the film formation. Like those, the diffusion barriers 119a, 119b and the diffusion barrier 127a are all titanium nitride (TiN) films, and it is desirable to form these films all at a time as facilitating the film formation. Of those, at least one of the copper films and the diffusion barriers is formed at least through sputtering. It is more desirable that a film with low contact resistance, such as a metal silicide film or the like, is provided between the diffusion barrier 114a and the diffusion layer 104.

Though not shown in FIG. 9, it is more desirable to additionally form a diffusion barrier on the side walls of the copper (Cu) film 117 and the copper (Cu) film 123 thereby preventing copper (Cu) atoms from diffusing into the insulating films from the side walls of the copper (Cu) film 117 and the copper (Cu) film 123.

The data of computer simulation shown in FIGS. 2, 3, 4 and 5 are those of molecular dynamics simulation. Molecular dynamics simulation is for a method of calculating the position of each atom at varying times by computing the force acting on each atom through interatomic potential followed by solving the Newton's equation of motion on the basis of that force, for example, as in *Journal of Applied Physics*, Vol. 54 (1983), pp. 4864-4878. A method for calculating a diffusion coefficient of a substance through molecular dynamics simulation is described, for example, in *Physical Review B*, Vol. 29 (1984), pp. 5363-5371. It is well known that reducing copper (Cu) diffusion improves the electromigration resistance of copper (Cu) films, for example, as in "Materials Reliability in Microelectronics", pp. 43-60 in Vol. 428 of *Symposium Proceedings of the Materials Research Society* (MRS). As so mentioned hereinabove, FIGS. 2, 3, 4 and 5 show the simulation data obtained herein at a temperature or 700 K, and the same effects could be shown under different simulation conditions including different temperatures, etc.

Figure 6:
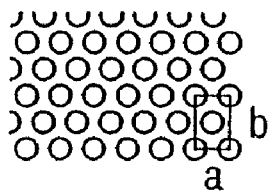
FIG. 6 is a view showing the atomic configuration in rectangular unit cells, and the short side and the long side of each unit cell.

FIG. 6 shows rectangular unit cells that constitutes the crystal plane with minimum free energy in a bulk crystal, in which the short side, a, and the long side, b, of the rectangular unit cell are defined. This is described in more detail hereinunder. The short side, a, indicates the interatomic distance between the nearest neighbors in a bulk crystal, which is referred to, for example, in a Japanese translation of *Introduction to Solid Stage Physics*, Part I, 5th Ed. (written by Charles Kittel, published by Maruzen in 1978), page 28. The long side, b, is about 1.73 times the short side, a, in crystals with the face-centered cubic structure or the hexagonal close-packed structure, but is about 1.41 times the short side, a, in crystals with the body-centered cubic structure. For example, the plane with minimum free energy of copper (Cu) having the face-centered cubic structure is the (111) plane, and its short side, $a_{cu}$, is about 0.26 nm, while its long side, $b_{cu}$, is about 0.44 nm. The plane with minimum free energy of ruthenium (Ru) having the hexagonal close-packed structure is the (001) plane, and its short side, $a_{Ru}$, is about 0.27 nm, while its long side, $b_{Ru}$, is about 0.46 nm.

Based on the results of the invention as above, we, the inventors have made researches about related techniques. As a result, we have found JP-A-10-229084 relating to copper (Cu) interconnects and diffusion barriers for them. However, this obviously differs from the present invention for the following reasons. Specifically, JP-A-10-229084 is directed to a technical theme for easy formation of a diffusion barrier and a copper (Cu) film interconnect in contact holes having a high aspect ratio, and its subject matter is to construct an interconnect structure by forming both the diffusion barrier and the Copper (Cu) film interconnect through plating or chemical vapor deposition (CVD) but not through physical vapor deposition (PVD) such as sputtering or the like. Being different from this, the present invention is directed to an interconnect structure for which at least one of a diffusion barrier and a copper (Cu) film interconnect is formed through physical vapor deposition, like those for ordinary interconnect structures. The subject matter of the present invention is to improve the electromigration resistance, which is especially important for films formed through physical vapor deposition. For an ordinary diffusion barrier and a copper (CU) film interconnect, at least one of them is formed through physical vapor deposition such as sputtering or the like, for example, as in a monthly journal, *Semiconductor World* (for February 1998, pp. 91-96, published by Press Journal). As so described therein, for forming a copper (Cu) film interconnect through plating or chemical vapor deposition (CVD), generally employed is a method comprising previously forming a seed layer for a copper (Cu) film through physical vapor deposition (PVD) such as sputtering or the like, which is then switched to plating or chemical vapor deposition (CVD) to complete the intended copper (Cu) film interconnect. Therefore, the method proposed in JP-A-10-229084, in which both a diffusion barrier and a copper (Cu) film interconnect are formed through plating or chemical vapor deposition (CVD) but not through physical vapor deposition (PVD) such as plating or the like, will be favorable to the object for forming them in contact holes having a high aspect ratio, but, at present, the method is scarcely put into practical use. The reason is, as so described, for example, in the monthly journal, *Semiconductor World* (for February 1998, pp. 86-96, published by Press Journal), because the seed layer for a copper (Cu) film as formed through physical vapor deposition (PVD) has better adhesiveness than that formed through chemical vapor deposition (CVD), because direct plating of a copper (Cu) film on a diffusion barrier is almost impossible, and because the diffusion barrier formed through chemical vapor deposition (CVD) has the disadvantage of either high electric resistance or poor barrier capabilities. Sputtering is most popularly employed for physical vapor deposition (PVD), for which is used a rare gas element (this may be referred to as a noble gas element), such as argon (Ar) xenon (Xe), krypton (Kr), neon (Ne) or the like, for example, as in *Thin Film Handbook* (published by Ohm Sha, Ltd., edited by the Japan Society for the Promotion of Science), pp. 171-196. Therefore, films as formed through sputtering shall inevitably contain the rare gas element used, in an amount of at least 0.0001%, but are preferred to those formed through plating or chemical vapor deposition (CVD) as having better adhesiveness than the latter.

Naturally, the terminology, diffusion barrier as referred to herein is meant to be a film for preventing the diffusion of an interconnect material such as copper (Cu) or the like. For example, the neighboring films 116a, 116b as provided adjacent to the conductor film 117 of copper (Cu) are diffusion barriers. However, the diffusion barrier may act for improving adhesiveness, or for controlling crystal orientation or even for controlling grain size, and, as the case may be, its primary role is often not for diffusion retardation. In the present specification, the neighboring films with conductivity, such as 116a, 116b, 114a, 114b that ate provided adjacent to conductor films are all referred to as diffusion barriers, even though they act for other objects but not for diffusion retardation only.

The copper (Cu) film referred to herein indicates a film for which the primary constituent element is copper (Cu), and it may additionally contain any other elements. With such other elements, the film could still exhibit the same effects as herein. The same shall apply to the ruthenium (Ru) film and others referred to therein.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising:
    a conductive film including copper as a main component and formed over a primary surface of a semiconductor substrate;
    a neighboring film consisting of ruthenium and formed in contact with the conductive film such that the conductive film is formed on the neighboring film;
    an insulating film formed under the neighboring film; and
    a barrier film including a high melting point metal as a component and formed between the neighboring film and the insulating film,
    wherein the conductive film, the neighboring film and the barrier film serve as an interconnect.

2. A semiconductor device according to claim 1, wherein the high melting point metal includes titanium.

3. A semiconductor device according to claim 1, wherein the high melting point metal includes tantalum.

4. A semiconductor device according to claim 1, wherein the high melting point metal includes tungsten.

5. A semiconductor device according to claim 1, wherein the conductive film has the (111) plane and has the face-centered cubic structure.

6. A semiconductor device according to claim 5, wherein the neighboring film has the (001) plane and has the hexagonal close-packed structure.

7. A semiconductor device according to claim 1, wherein the neighboring film has the (001) plane and has the hexagonal close-packed structure.

8. A semiconductor device according to claim 1, wherein the barrier film serves to prevent copper diffusion.

9. A semiconductor device comprising:
    a first insulating film formed over a primary surface of a semiconductor substrate;
    a first barrier film including a high melting point metal as a component and formed over the first insulating film;
    a first neighboring film consisting of ruthenium and formed over the first barrier film;
    a first conductive film including copper as a main component and formed over the first neighboring film,
    the first conductive film, the first neighboring film and the first barrier film serving as a first interconnect;
    a second insulating film formed over the first conductive film;
    a second barrier film including a high melting point metal as a component and formed over the first insulating film;
    a second neighboring film consisting of ruthenium and formed over the second barrier film; and
    a second conductive film including copper as a main component and formed over the second neighboring film,
    the second conductive film, the second neighboring film and the second barrier film serving as a second interconnect.

10. A semiconductor device according to claim 9, wherein the second interconnect is electrically connected to the first interconnect through an opening formed in the second insulating film.

11. A semiconductor device according to claim 9, wherein each of the high melting point metals includes titanium.

12. A semiconductor device according to claim 9, wherein each of the high melting point metals includes tantalum.

13. A semiconductor device according to claim 9, wherein each of the high melting point metals includes tungsten.

14. A semiconductor device according to claim 9, wherein the second conductive film has the (111) plane and has the face-centered cubic structure.

15. A semiconductor device according to claim 14, wherein the second neighboring film has the (001) plane and has the hexagonal close-packed structure.

16. A semiconductor device according to claim 9, wherein the second neighboring film has the (001) plane and has the hexagonal close-packed structure.

17. A semiconductor device according to claim 9, wherein each of the barrier films serves to prevent copper diffusion.

* * * * *